(12) United States Patent
Bertin et al.

(10) Patent No.: US 6,294,406 B1
(45) Date of Patent: *Sep. 25, 2001

(54) HIGHLY INTEGRATED CHIP-ON-CHIP PACKAGING

(75) Inventors: Claude Louis Bertin, South Burlington; Thomas George Ference, Essex Junction; Wayne John Howell, Williston; Edmund Juris Sprogis, Underhill, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/350,274

(22) Filed: Jul. 6, 1999

Related U.S. Application Data

(62) Division of application No. 09/105,419, filed on Jun. 26, 1998, now Pat. No. 5,977,640.

(51) Int. Cl.[7] .......................... H01L 21/44; H01L 21/48; H01L 21/50; H01L 23/48; H01L 23/52
(52) U.S. Cl. .................... 438/109; 257/777; 257/778; 257/780
(58) Field of Search .................... 438/109; 257/777, 257/778, 780, 738, 686; 361/729, 735

(56) References Cited

U.S. PATENT DOCUMENTS

| | | | |
|---|---|---|---|
| 4,703,483 | 10/1987 | Enomoto et al. | 371/24 |
| 5,109,320 | 4/1992 | Bourdelaise et al. | 361/413 |
| 5,323,060 | 6/1994 | Fogal et al. | 257/777 |
| 5,399,898 | 3/1995 | Rostoker | 257/499 |
| 5,401,672 | 3/1995 | Kurtz et al. | 437/186 |
| 5,434,453 | 7/1995 | Yamamoto et al. | 257/777 |
| 5,446,247 | 8/1995 | Cergel et al. | 174/267 |
| 5,495,394 | 2/1996 | Kornfeld et al. | 361/764 |
| 5,541,449 | 7/1996 | Crane, Jr. et al. | 257/697 |
| 5,563,773 | 10/1996 | Katsumata . | |
| 5,576,519 | 11/1996 | Swamy | 174/265 |
| 5,600,541 | 2/1997 | Bone et al. | 361/707 |
| 5,760,478 | 6/1998 | Bozso et al. | 257/777 |
| 5,770,480 | * 6/1998 | Ma et al. | 438/123 |
| 5,790,384 | 8/1998 | Ahmad et al. | 361/760 |
| 6,069,025 | * 5/2000 | Kim | 438/109 |

OTHER PUBLICATIONS

IBM Technical Disclosure Bulletin, vol. 22 No. 10 Mar. 1980, High Performance Package with Conductive Bonding to Chips, Coombs et al., 2 pages.
IBM Technical Disclosure Bulletin, vol. 14 No. 6 Nov. 1971, Chip Joining Process, Lavanant et al., 2 pages.
Interconnect Reliability of Ball Grid Array and Direct Chip Attach, Topic 2, Andrew Mawer, 17 pages.
IBM Technical Disclosure Bulletin, vol. 10 No. 5, Semiconductor Chip Joining, Miller et al., 2 pages.
IBM Technical Disclosure Bulletin, vol. 31 No. 2 Jul. 1988, Plastic Package for Semiconductors with Integral Decoupling Capacitor, Howard et al., 2 pages.
IBM Technical Disclosure Bulletin, vol. 36 No. 12 Dec. 1993, Postage Stamp Lamination of Reworkable Interposers for Direct Chip Attach, pp. 487 and 488.

* cited by examiner

*Primary Examiner*—Charles Bowers
*Assistant Examiner*—Neal Berezny
(74) *Attorney, Agent, or Firm*—Schmeiser, Olsen & Watts; Howard J. Walter, Jr.

(57) ABSTRACT

The advantages of the invention are realized by a chip-on-chip module having at least two fully functional chips, electrically connected together, and a chip-on-chip component connection/interconnection for electrically connecting the fully functional chips to external circuitry.

10 Claims, 7 Drawing Sheets

HIGHLY INTEGRATED CHIP-ON-CHIP PACKAGING

RELATED APPLICATIONS

This application is a divisional of Ser. No. 09/105,419, filed on Jun. 26, 1998 now U.S. Pat. No. 5,977,640, and is related to two co-pending applications: U.S. Ser. No. 09/105,382 entitled "Micro-flex Technology in Semiconductor Packages," by Bertin et al.; and U.S. Ser. No. 09/105,477 entitled "Chip-on-Chip Interconnections of Varied Characteristics," by Ference et al. The related applications are assigned to the assignee of record and are incorporated herein by reference.

BACKGROUND OF THE INVENTION

1. Technical Field

The invention relates generally to semiconductor devices, and more specifically, to chip-on-chip packaging in semiconductor devices.

2. Background Art

Considerable advancement has occurred in the last fifty years in electronic development and packaging. Integrated circuit density has and continues to increase at a significant rate. However, by the 1980s, the increase in density in integrated circuitry was not being matched with a corresponding increase in density of the interconnecting circuitry external of circuitry formed within a chip. Many new packaging technologies have emerged. One specific technology is referred to as "chip-on-chip module" technology. This invention concerns the specific art area of chip-on-chip modules.

In many cases, chip-on-chip modules can be fabricated faster and more cheaply than by designing new substrate integrated circuitry. Chip-on-chip module technology is advantageous because of the density increase. With increased density comes equivalent improvements in signal propagation speed and overall device weight unmatched by other means. Current chip-on-chip module construction typically consists of a printed circuit board substrate to which a series of integrated circuit components are directly adhered.

There are further a number of distinct art areas associated with how a substrate adhered circuit of a chip-on-chip module is electrically externally connected to circuitry on the substrate. These art areas include wire bonding, tape automated bonding (TAB), flip-TAB and flip-chip. Some examples are found in the following U.S. Patents: U.S. Pat. No. 5,323,060, "Multichip Module Having a Stacked Chip Arrangement", issued June 1994 to Fogal el al.; U.S. Pat. No. 5,600,541, "Vertical IC Chip Stack With Discrete Chip Carriers Formed From Dielectric Tape", issued February 1997 to Bone et al.; U.S. Pat. No. 5,495,394, "Three Dimensional Die Packaging in Multi-chip Modules", issued February 1996 to Komeld et al.; and U.S. Pat. No. 5,399,898, "Multi-Chip Semiconductor Arrangements Using Flip Chip Dies", issued March 1995 to Rostoker.

Unfortunately these technologies are expensive and in most cases do not allow rework (i.e., removal and replacement) of the package constituents; thereby decreasing the yield and increasing the cost. Chip-scale personalization is also severely limited. Currently chips can be personalized at the wafer-level or the package-level. The inability to personalize a chip post-wafer fabrication but before packaging does not allow significant product application flexibility and manufacturing cost advantages.

SUMMARY OF THE INVENTION

It is thus an advantage of the present invention to provide chip-on-chip components, interconnects, and method of making the same that eliminate the above-described and other limitations.

The advantages of the invention are realized by a chip-on-chip module having at least two fully functional independent chips, electrically connected together, and a chip-on-chip component connection/interconnection for electrically connecting the chips to external circuitry.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
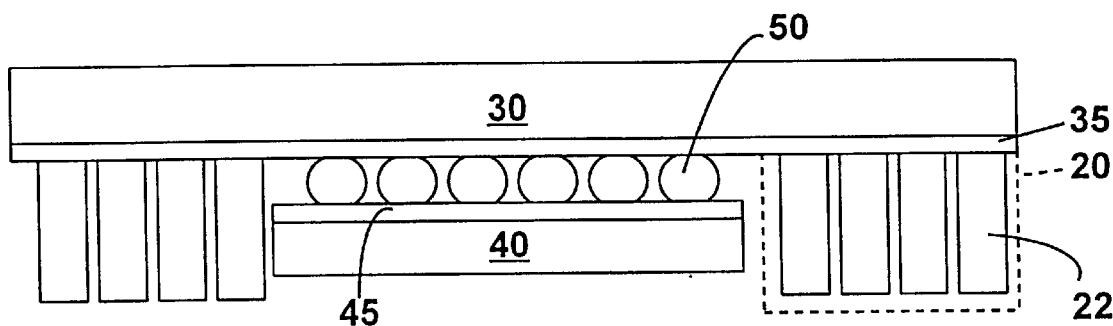
FIG. 1 is a cross-sectional view of a chip-on-chip component having a first exemplary chip-on-chip component connection in accordance with a preferred embodiment of the present invention.

Referring to FIG. 1, a first exemplary chip-on-chip component 10 in accordance with a preferred embodiment of the present invention is shown. Chip-on-chip component 10 comprises a first chip 30, a second chip 40 and chip-on-chip component colmections 20. The active region 35 of the first chip 30 is electrically connected to the active region 45 of the second chip 40 via electrical inter-chip connections, such as C4 (controlled collapse chip connection) solder ball connections 50, or photonic interconnects. The solder ball connections 50 provide a high performance electrical pathway for inter-chip communication. This interconnection, coupled with the inherent high performance of chip electrical wiring, dramatically reduces the size and power of off-chip drivers (not shown) for both the first chip 30 and the second chip 40. Although solder balls and solder columns are specifically shown for this and subsequent examples, it is to be understood that other interconnections of different compositions may also be used, such as polymer-metal composite interconnections, plated copper columns, micro-velcro connections, etc.

In this specific example, chip-on-chip component connection 20 is a solder column 22, which is connected to the first chip 30. Solder column 22 allows for connections of chip-on-chip component 10 to external circuitry, typically through a substrate.

Figure 2:
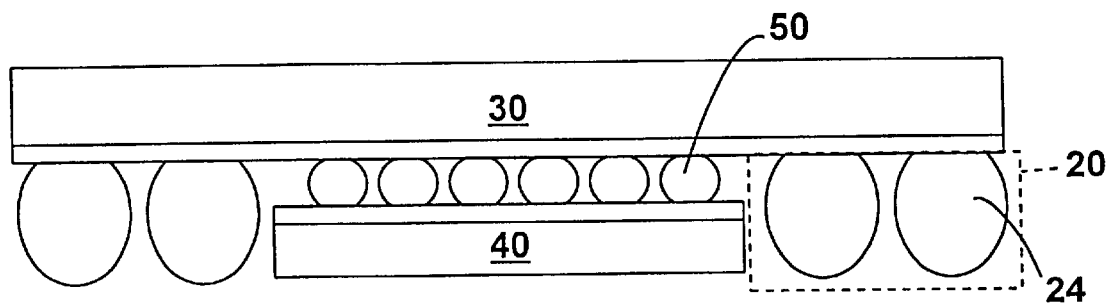
FIGS. 2, 3 and 4 are cross-sectional views of a chip-on-chip component having a second, third, and fourth exemplary chip-on-chip component connection in accordance with the preferred embodiment of the present invention.

FIG. 2 illustrates a second exemplary chip-on-chip component, wherein the chip-on-chip component connection 20 comprises solder balls 24. In both FIG. 1 and FIG. 2, exemplary methods of fabricating the solder columns and solder balls are found in IBM Dkt. No. BU9-98-011, which is referenced above in Related Applications. The solder columns and balls may also be fabricated through the following steps:

1) Fabricate the first chip with solderable metal pads. The outer perimeter region pads, which could be used for solder column pads would be, for example, 125 micrometers ($\mu$m) in diameter on a 250 $\mu$m pitch. The center region pads could be 50 $\mu$m (diameter) by 100 $\mu$m (pitch).
2) Fabricate the second chip with an array of C4 solder balls. The C4 composition may be of 97/3 Pb/Sn and the C4 should match the pitch of the center region pads of the first chip.
3) Attach the first chip to the second chip. This may be done through standard chip pick and place (CPP) technology, or through join processes such as no-clean flux, PADS, rosin-basin flux with a furnace reflow, etc.
4) Attach solder columns or balls to the second chip. The attachment may be done through solder injection molding.
5) Join chip-on-chip component to substrate. This may be done by joining eutectic solder on the substrate surface mount technology (SMT) pads through standard place and join technologies.

Figure 3:
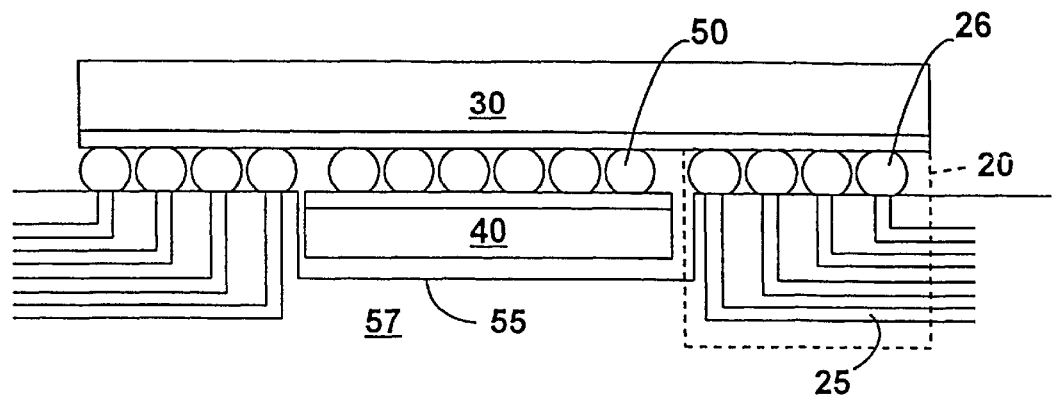
Figure 4:
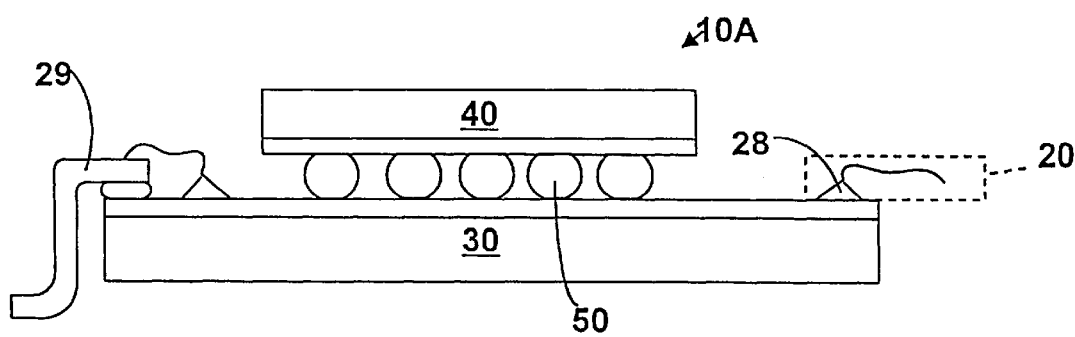

FIGS. 3 and 4 illustrate a third and fourth example of chip-on-chip components, wherein the chip-on-chip component connection 20 comprises solder balls 26 and wiring 25 (FIG. 3), or wirebond 28 (FIG. 4). In FIG. 3, a cavity 55 is created into substrate 57, allowing the top of second chip 40 to be even with the top of substrate 57. Solder balls 26 may then be the same size as connecting solder balls 50 to connect the chip-on-chip component to substrate 57. FIG. 4 further illustrates connecting a chip-on-chip component to a leadframe 29, which is discussed in greater detail in IBM Dkt. No. BU9-97-064, which is referenced above in Related Applications.

Figure 5:
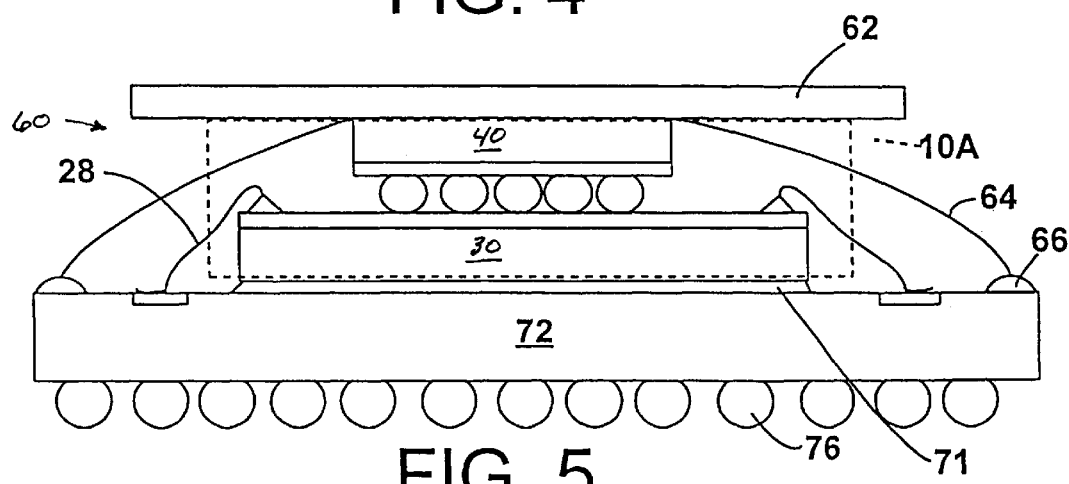
FIG. 5 is a cross-sectional view of a chip-on-chip package using the exemplary chip-on-chip component connection of FIG. 4.

FIG. 5 illustrates a chip-on-chip package using the chip-on-chip component 10A of FIG. 4. The wirebond 28 is connected to the top side of substrate 72. The bottom side of substrate 72 comprises solder balls 76 for connecting the chip-on-chip package to a different level of packaging. Adhesive 71 mechanically connects chip-on-chip component 10A to substrate 72. A resin dam 66 and encapsulant 64 protect chips 30 and 40 and create a durability to the wirebond 28 and chip structure 60. Metal lid 62 provides a compact, durable and thermally-enhanced chip-on-chip package.

Figure 6:
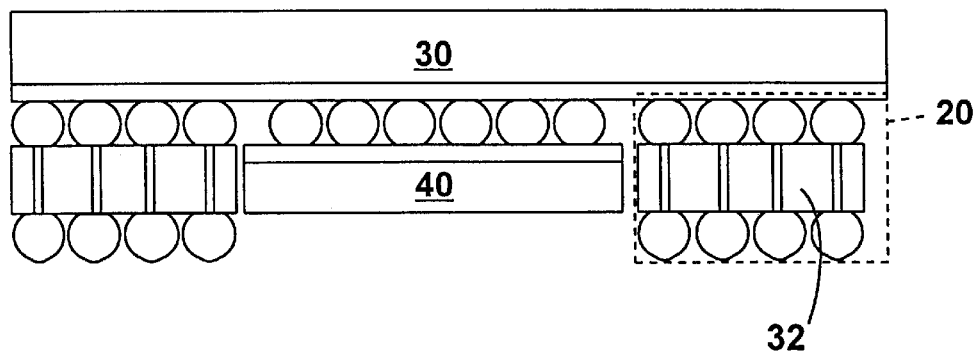
FIG. 6 is a cross-sectional view of the chip-on-chip component of FIG. 1 with a fifth exemplary chip-on-chip component connection.
Figure 7:
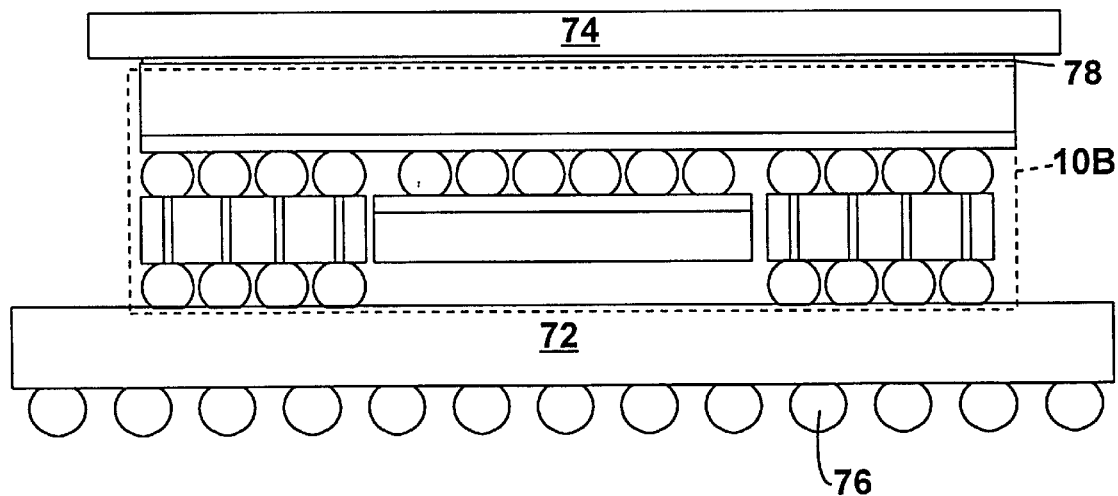
FIG. 7 is a cross-sectional view of a chip-on-chip package using the exemplary chip-on-chip component connection of FIG. 6.

As seen in FIGS. 6 and 7, chip-on-chip component connection 20 of chip-on-chip component 10B comprises a solder ball interposer 32. Solder ball interposer 32 provides both the electrical interconnection to the substrate and the height required to allow for clearance of the second chip 40. The solder ball interposer 32 is made up of a first set of solder balls, connected to the active regions of one of the chips 30, a second set of solder balls, connected to the external circuitry, and a conductive channel between the first set and the second set of solder balls. The channel is surrounded by nonconductive material. FIG. 7 illustrates a chip-on-chip package using the chip-on-chip component 10B of FIG. 6. The solder ball interposer is connected to the top side of substrate 72. The bottom side of substrate 72 comprises solder balls 76 for connecting the chip-on-chip package to a different level of packaging. A heatspreader 74 is connected to the first chip 30 through an adhesive 78. The heatspreader 74 allows for heat dissipation for chip-on-chip component 10B.

Some of the advantages of chip-on-chip component of FIGS. 1–7 and subsequent examples include: chips 30 and 40 may be fabricated from dissimilar semiconductor technologies and connected together without the limitations inherent if these technologies were used on a single chip. For example, chip 30 could be a logic chip and chip 40 could be a DRAM chip, creating a merged logic/DRAM at the chip-on-chip component level. Second, chips 30 and 40 individually are smaller and less complex compared to a single chip with all the functions and circuitry present in each chip. Third, large amounts of memory may be in close proximity to a processor. Fourth, there are greater interconnection densities because of the extremely planar and metallurgical features of the chip-on-chip component. Finally, the chip-on-chip component of the present invention provides lower cost, lower power and a higher performance than a single highly integrated chip providing the same functions.

Figure 8:
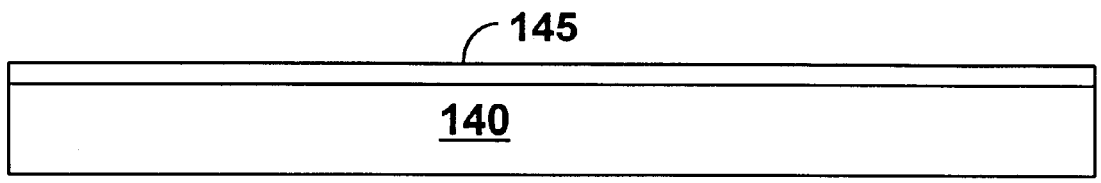
FIGS. 8, 9, 10, 11, 12 and 13 are cross-sectional diagrams illustrating a fabrication sequence of a chip-on-chip component in accordance to a second embodiment of the present invention.
Figure 9:
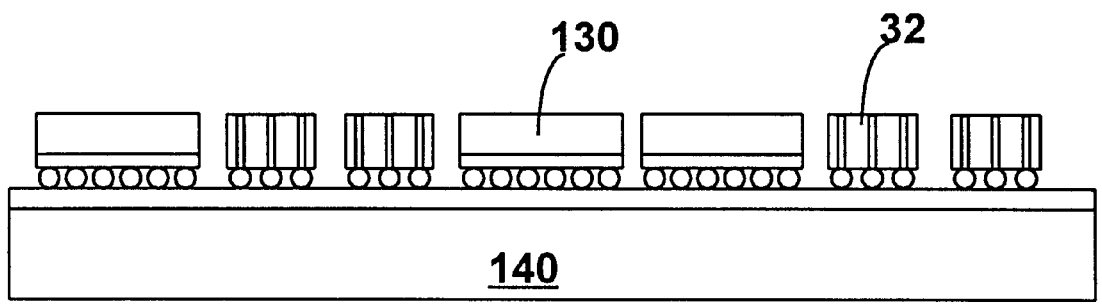

FIGS. 8–13 are cross-sectional diagrams illustrating a fabrication sequence of a chip-on-chip component in accordance to a second embodiment of the present invention. In FIG. 8, a chip wafer 140 with active circuitry and interconnection layer 145 is shown. The wafer 140 may be, for example, a silicon wafer, Ga-As wafer, Si-Ge wafer, etc. The active circuitry and interconnection layer 145 contains the structures and features necessary for external interconnection. In FIG. 9, two types of components are attached to wafer 140: integrated circuit (IC) chips 130 and solder ball interposers (also known as spacers) 32. IC chip 130 is electrically coupled to the active circuits in the wafer 140 and provide higher-level integrated circuit functions. Electrical connections such as solder balls and wirebond with encapsulation may be used. Solder ball interposers 32 provides an electrical pathway between the active circuit layer 145 on wafer 140 and the plane formed by the active circuit layer side of the IC chips 130. Although solder ball interposers 32 are specifically shown in this example, other spacers, such as silicon chips with thru-vias, multilayer ceramics and organic PCB spacers may also be used. Also, although solder balls are used in this example to connect the IC chips 130 and solder ball interposers 32 to the wafer 140, other interconnection means are also possible, such as conductive epoxy, PMC paste, anisotropic conductive adhesive, and transient liquid phase bonding. Solder ball encapsulants (not shown) may be used to surround the solder balls.

Figure 10:
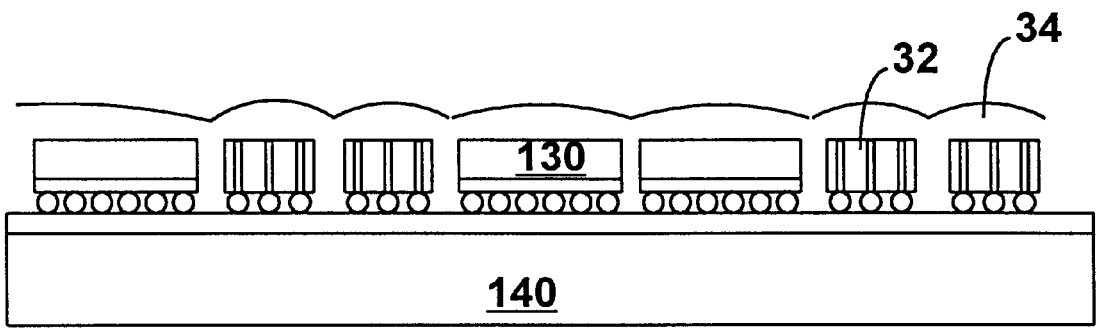
Figure 11:
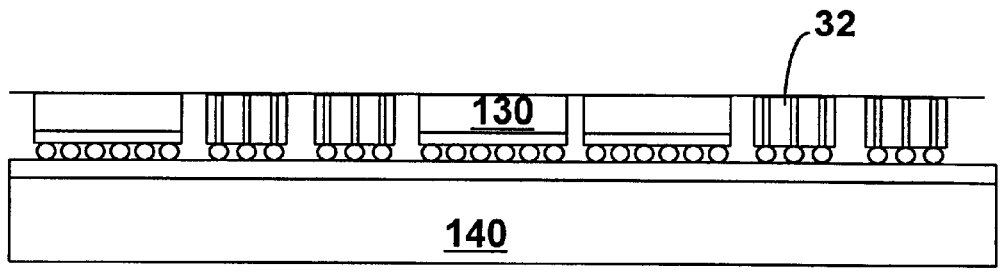
Figure 12:
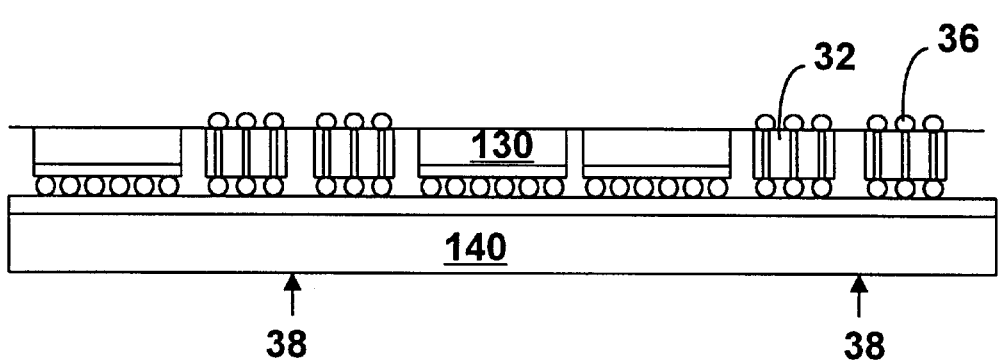
Figure 13:
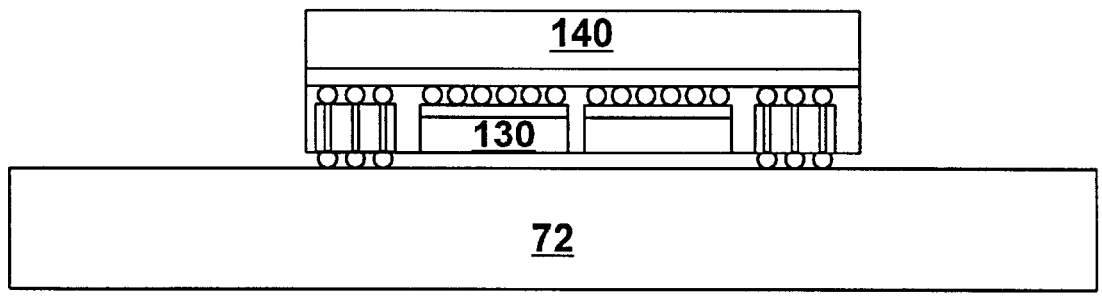

As seen in FIG. 10, a conformal coating 34 (e.g., paralene) is deposited over the entire surface. This coating is then planarized, as shown in FIG. 11, using either a mechanical and/or chemical device. One example of planarizing would be to mechanically polish the surface using standard wafer polishing techniques. This planarization results in a structure wherein the interconnection vias in the solder ball interposers 32 are presented at the surface. These vias enable connection to external circuitry. FIG. 12 illustrates fabricating solder balls 36 on the solder ball interposer 32 for interconnection to external circuitry. The chip-on-chip component is diced at predefined points 38, forming a "superchip" that can be connected to external circuitry using the solder balls 36. FIG. 13 shows the superchip connected to a carrier/substrate 72. There are several advantages of fabricating the superchip as shown in FIG. 13. Some advantages include: a very high level of integration using multiple, dissimilar semiconductor technologies; an excellent performance in component speed, bandwidth requirements and off-chip speed; the constituent chips are physically small and do not require complex circuitry or fabrication technologies, resulting in high yield and low cost; and personalization can be achieved by linking several constituent components in various configurations.

Figure 14:
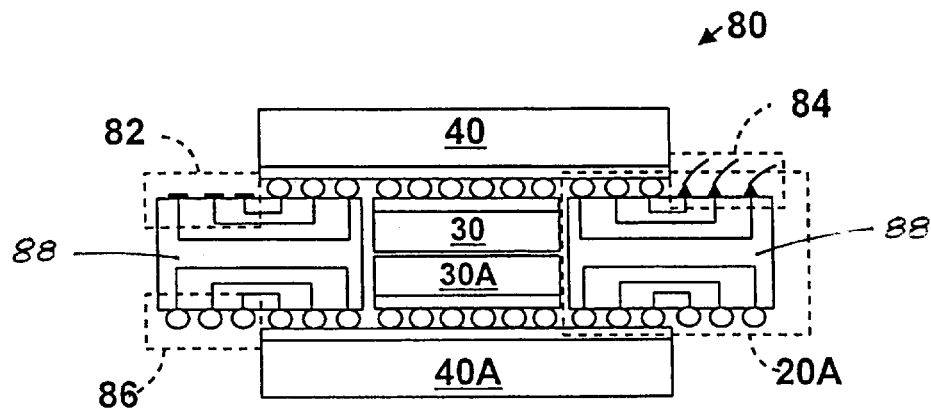
FIG. 14 is a cross-sectional view of a chip-on-chip component in accordance to a third embodiment of the present invention.
Figure 15:
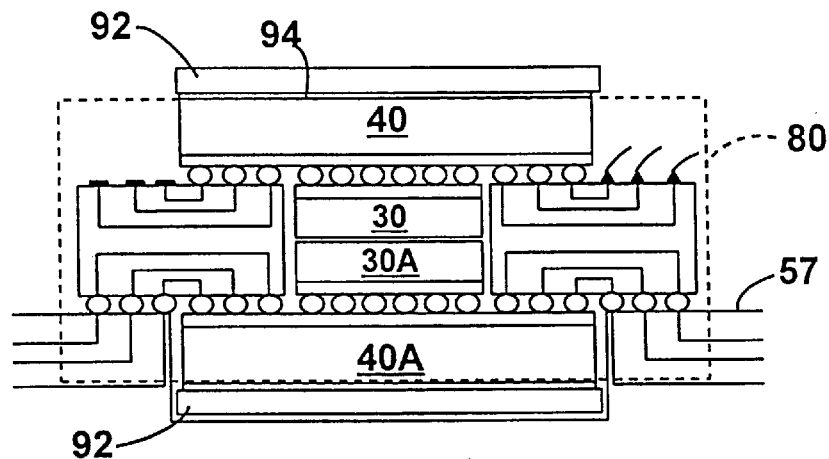
FIG. 15 is a cross-sectional view of a chip-on-chip package using the chip-on-chip component of FIG. 14.

FIGS. 14 and 15 are cross-sectional views of a chip-on-chip component 80 in accordance to a third embodiment of the present invention. Chip-on-chip component 80 comprises two groupings of two chips, each grouping having a first chip electrically connected to a second chip 30 and 40, and 30A and 40A (e.g., such as two chip-on-chip components 10 in FIG. 1). In this example, the backsides of chips 30 and 30A face each other. The two groupings of chips are electrically connected together through chip-on-chip component connection 20A, which in this example is an interconnection substrate 88. Interconnection substrate 88 also connects chip-on-chip component 80 to external devices through electrical connections, such as wirebonds 84, C4 connections 86, and metallurgical pad connections 82. Although different types of connections are shown on the chip-on-chip components 80 of FIGS. 14 and 15 for illustration purposes, generally only one type of connection would be used for a single application (i.e., connections 82, 84, and 86 would all be, for example, C4 connections). FIG. 15 illustrates a chip-on-chip package using the chip-on-chip component 80 of FIG. 14. Two heatspreaders 92 are connected to the chips 30 and 30A through an adhesive 94. Heatspreaders 92 allow for heat dissipation for chip-on-chip component 80. Chip-on-chip component 80 is then coupled to substrate 57 through solder balls 86 (FIG. 14). Thus, as illustrated in accordance with this embodiment of the present invention, several chips, each providing a separate and specific function and potentially fabricated using different semiconductor technologies, may be joined together.

Figure 16:
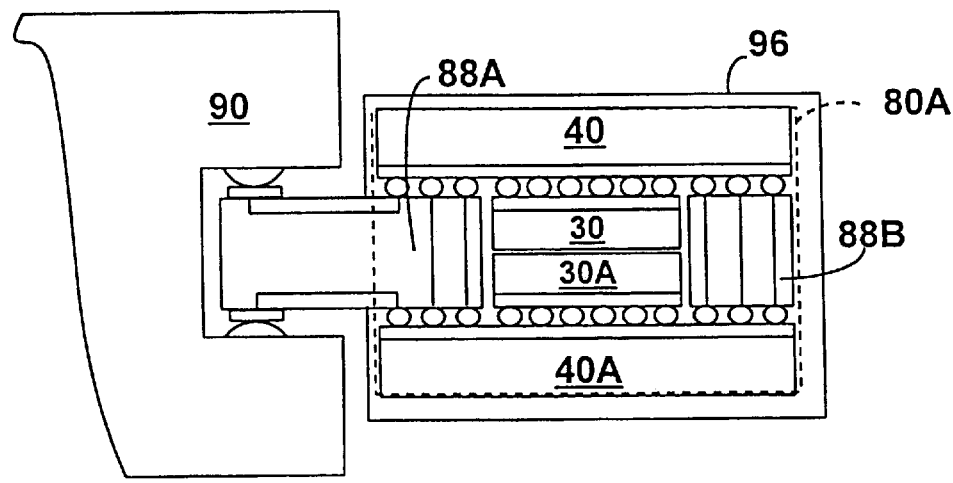
FIG. 16 is a cross-sectional view of a chip-on-chip component in accordance to a fourth embodiment of the present invention.

FIG. 16 is a cross-sectional view of a pluggable chip-on-chip package comprising chip-on-chip component 80A in accordance to a fourth embodiment of the present invention. Chip-on-chip component 80A comprises chips 30, 30A, 40, 40A, interconnection substrate 88A and coupling substrate 88B. In this example, chip-on-chip component 80A is encapsulated with encapsulant 96, which provides a robust component. The interconnection substrate 88A enables electrical connection to external circuitry through a pluggable interface 90.

Figure 17:
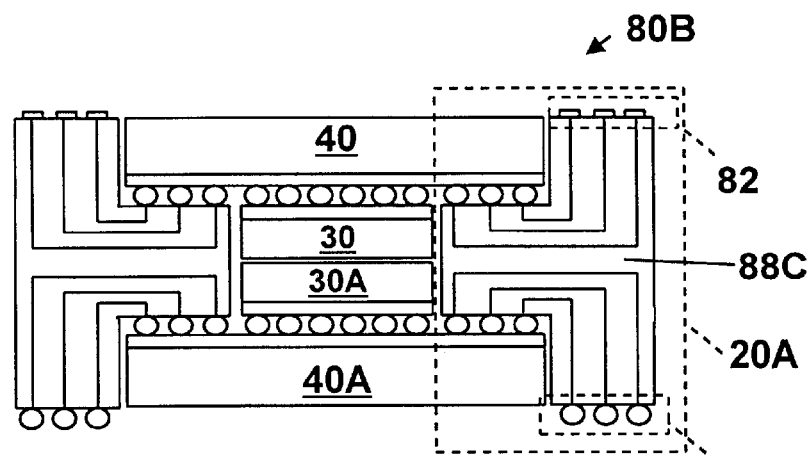
FIG. 17 is a cross-sectional view of a chip-on-chip component in accordance to a fifth embodiment of the present invention.
Figure 18:
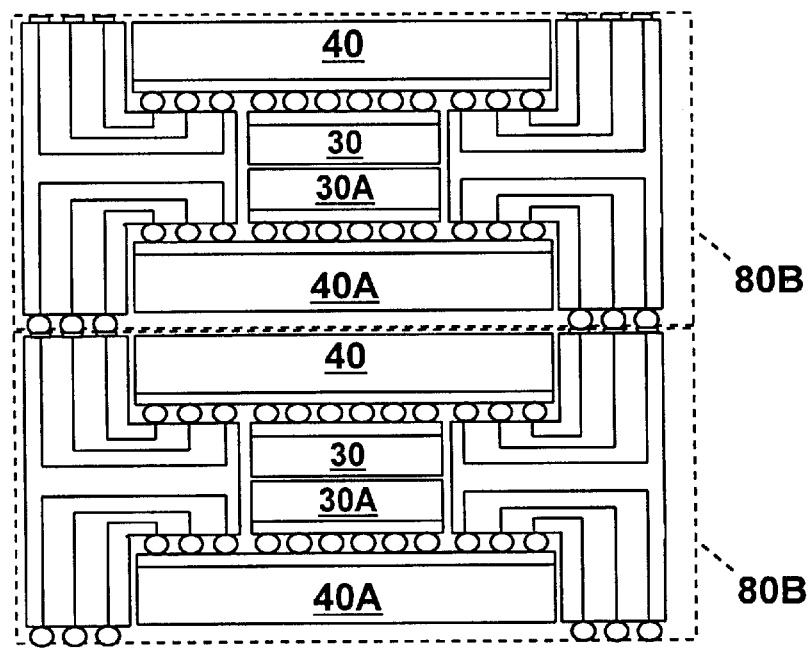
FIG. 18 is a cross-sectional view of a chip-on-chip packages using the chip-on-chip component of FIG. 17.

FIG. 17 is a cross-sectional view of a chip-on-chip component 80B in accordance to a fifth embodiment of the present invention. Chip-on-chip component 80B is similar to chip-on-chip component 80 (FIG. 14) except the chip-on-chip component connection 20A comprises a stackable interconnection substrate 88C that extends to the upper and lower surfaces of chip-on-chip component 80B. The upper surface of the chip-on-chip component connection 20A comprises solderable metallurgical pads 82 and the lower surface of the chip-on-chip component connection 20A comprises solder balls 86. Chip-on-chip component structure 80B is an exemplary unit structure for a three-dimensional, stackable module. Another exemplary unit structure could comprise eliminating chips 40 and 40A and extending the chip-on-chip component connection 20A across chips 30 and 30A. FIG. 18 illustrates a stacked module containing two chip-on-chip component unit structures 80B of FIG. 17.

Some advantages of the stacked module and unit structure are: first, chips of different sizes and thicknesses may be easily accommodated. Second, the structure is reworkable. Third, structures of various sizes are possible without significant predefinition, and fourth, inter-unit structure thermal management is possible.

Thus, chip-on-chip components and connections according to the present invention allow for highly integrated technology and reliable, compact semiconductor packages. Chip-on-chip packages also provide enhanced electrical, mechanical and thermal performance.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method of fabricating a chip-on-chip component comprising the steps of:
   a) fabricating a chip-on-chip module having at least two independently operable chips with active regions electrically connected together, wherein said active regions of said two chips are facing each other and said chips may be personalized post-wafer fabrication; and
   b) fabricating a chip-on-chip component connection for electrically connecting said chip-on-chip module to external circuitry.

2. The method of claim 1, wherein steps a) and b) further comprise the steps of:
   1) providing a wafer with a wafer active region;
   2) attaching integrated circuit (IC) chips having IC active regions to said wafer, wherein said IC active regions are connected to said wafer active region;
   3) attaching chip-on-chip component connections to said wafer active region, wherein said chip-on-chip component connections have at least a same height as said IC chips;
   4) depositing a conformal coating over said wafer, said attached IC chips and said attached chip-on-chip component connections;
   5) planarizing said coating to at least a same height of said chip-on-chip component connections to form a chip-on-chip wafer; and
   6) dicing said chip-on-chip wafer at predefined points to form a chip-on-chip component having said chip-on-chip module and said chip-on-chip component connection.

3. The method of claim 1, wherein step b) further comprises the steps of:
   1) providing a first set of solder balls;
   2) connecting said first set of solder balls to said active regions of one of said chips;

3) providing a second set of solder balls for connection to said external circuitry; and 4) connecting said first set and said second set of solder balls with a conductive channel surrounded by nonconductive material to form a solder ball interposer.

4. The method of claim 1, wherein the at least two chips are of different technologies.

5. The method of claim 1, wherein step b) further comprises the steps of:

1) providing a first set of connection elements;

2) connecting said first set of connection elements to said active regions of one of said chips;

3) providing a second set of connection elements for connection to said external circuitry; and 4) connecting said first set and said second set of connection elements with a substrate having conductive lines to form an interconnection substrate.

6. The method of claim 5, wherein said external circuitry is a pluggable connection.

7. The method of claim 5, wherein step 3) further comprises the steps of:

3a) planarizing a first surface of said interconnection substrate planar with a first backside of one of said at least two chips, and planarizing a second surface of said interconnection substrate planar with a second backside of another of said at least two chips;

3b) providing a second set of connection elements, planar with said first backside;

3c) providing a third set of connection elements, planar with said second backside; and 3d) connecting said chip-on-chip module to a second chip-on-chip module through said second and third sets of connection elements.

8. The method of claim 7, wherein the second set of connection elements of step 3d) includes solder balls.

9. The method of claim 7, wherein the third set of connection elements of step 3d) includes metallurgical pads.

10. The method of claim 7, wherein the third set of connection elements of step 3d) includes wirebonds.

* * * * *